United States Patent [19]

Jackson et al.

[11] 3,871,018

[45] Mar. 11, 1975

[54] CONSTRUCTION OF PACKAGES FOR SEMICONDUCTOR DEVICES

[75] Inventors: Sydney Jackson, Hayfield; Joseph Bell Titterington, Burnley, both of England

[73] Assignee: Ferranti Limited, Hollinwood, England

[22] Filed: July 9, 1973

[21] Appl. No.: 377,177

Related U.S. Application Data

[63] Continuation of Ser. No. 236,324, March 20, 1972, abandoned.

[30] Foreign Application Priority Data

Mar. 26, 1971 Great Britain ...................... 8720/71
May 1, 1971 Great Britain .................... 12599/71

[52] U.S. Cl. ........................ 357/74, 357/70, 357/73, 174/52 S, 174/DIG.3

[51] Int. Cl. .............................................. H01l 1/10

[58] Field of Search ....... 317/234 F, 234 G; 357/70, 357/73, 74; 174/52 S, DIG.3

[56] References Cited

UNITED STATES PATENTS

| | | | |
|---|---|---|---|
| 2,933,634 | 4/1960 | Lederer | 313/331 |
| 3,404,213 | 10/1968 | Brookover et al. | 174/52 |
| 3,408,222 | 10/1968 | Navias | 117/70 |
| 3,469,017 | 9/1969 | Starger | 174/52 |

OTHER PUBLICATIONS

A. Monack, "The Glass Industry," Vol. 27, 1946, p. 389, Table XVI.

Texas Instruments Bulletin No. DL-S 1084, May 1959, p. 801.

*Primary Examiner*—Michael J. Lynch
*Assistant Examiner*—Joseph E. Clawson, Jr.
*Attorney, Agent, or Firm*—Gordon W. Daisley; Edward J. Kondracki

[57] ABSTRACT

A semiconductor package has a sub-assembly unit comprising a lead frame bonded onto a metal support by a composite glass frit layer on the peripheral parts of the support, a semiconductor device is bonded to the support, or to an intermediate member comprising part of the support, and a metal capping member is secured to the lead frame by an adhesive coating on a glass frit base layer on the capping member.

7 Claims, 5 Drawing Figures

CONSTRUCTION OF PACKAGES FOR SEMICONDUCTOR DEVICES

This is a continuation, of application Ser. No. 236,324 filed Mar. 20, 1972 and now abandoned.

This invention relates to the construction of packages in which semiconductor devices are to be sealed.

It is an object of the present invention to provide for a semiconductor device a novel and advantageous package construction.

According to the present invention a package construction for a semiconductor device includes a sub-assembly unit having a metal support to which the semiconductor device is to be bonded, conductors initially comprising a lead frame, and selectively on peripheral parts of the support a glass frit layer having a composite composition comprising a base layer with an affinity for the material of the support, and on the base layer securing the conductors on to the support a glass frit coating with a melting point below that of the base layer, the composite glass frit layer insulating the conductors from the support, the package construction also including, to seal a semiconductor device bonded to the support within the package, a metal capping member to be secured to the sub-assembly unit, on the capping member a base layer of glass frit with an affinity for the material of the capping member, and on at least part of the base layer an adhesive coating to secure the conductors to the capping member, when so secured the conductors being insulated from the capping member, and the support, the capping member and the composite glass frit layer on the support have co-efficients of linear expansion substantially the same.

According to another aspect, the present invention resides in a packaged semiconductor device including a sub-assembly unit and a metal capping member as referred to above, the device being bonded to the sub-assembly unit and the capping member being secured to the sub-assembly unit, the arrangement being such that an end portion of each contact is adjacent to a contact-bearing face of the semiconductor device, and electrical interconnections are provided to extend individually between the contacts on the device and the end portions of the conductors.

Figure 1:
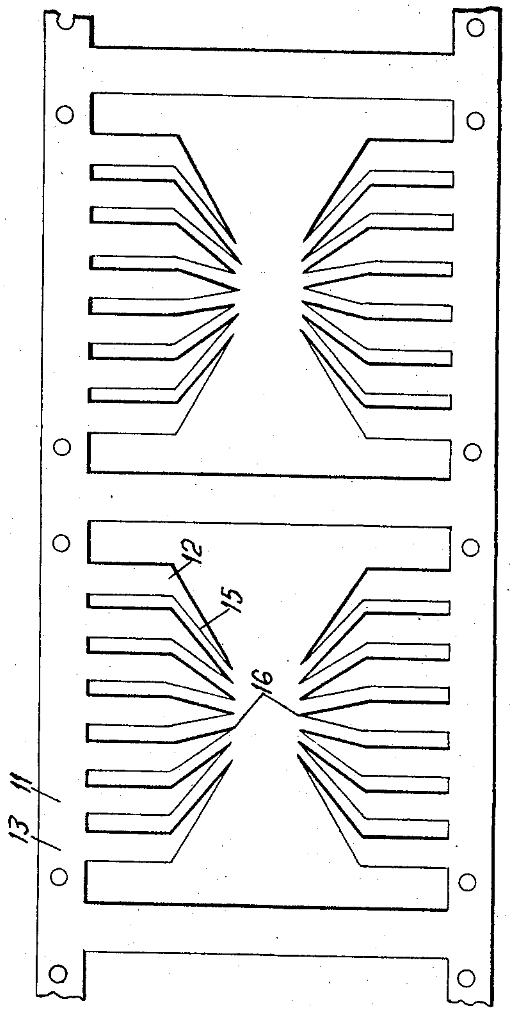
Figure 2:
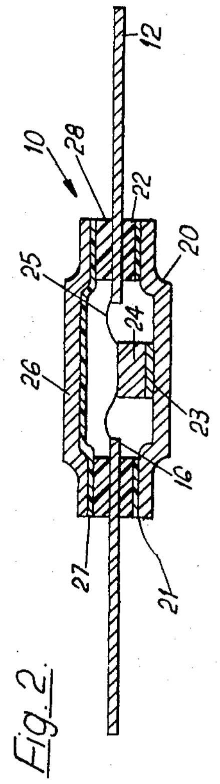
Figure 3:
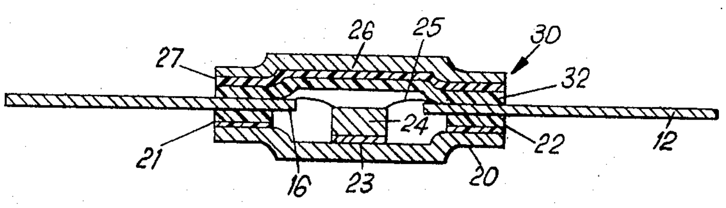
Figure 4:
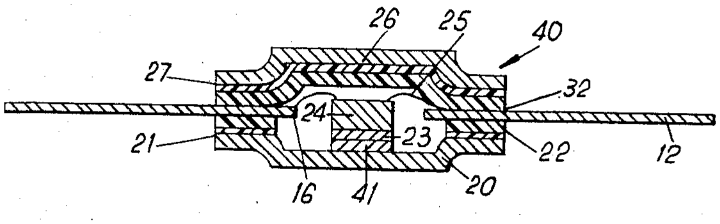
Figure 5:
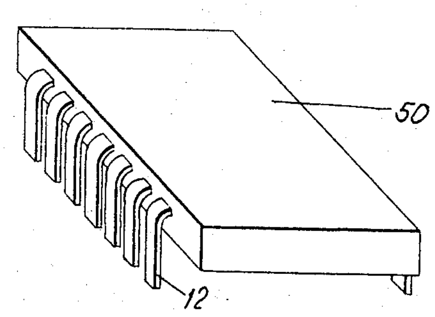

The present invention will now be described by way of example with reference to the accompanying drawings, in which FIG. 1 is a plan view of a lead frame strip used in the fabrication of a package construction for a semiconductor device, FIG. 2 is a section of the package construction including a lead frame of FIG. 1, and according to one embodiment of the present invention, FIG. 3 is a section of an alternative package construction, FIG. 4 is a section of a modification of the package construction of FIG. 3, and FIG. 5 is a perspective view of the package construction of FIGS. 2 or 3 or 4 after it has been completed.

The package construction 10 for a semiconductor device as shown in FIG. 2 includes a lead frame shown in FIG. 1. The lead frame has 14 constituent conductors 12, seven conductors extending from each of two opposing sides of a rectangular-shaped boundary part 13 of the lead frame 11. The parts 15 of the conductors 12 remote from the boundary part 13 of the lead frame 11 are tapered in width and for adjacent conductors are inclined in relation to each other, extending to end portions 16 of substantially zero width. The end portions of each group of seven conductors are distributed equally along a line parallel to the opposing sides of the boundary part 13 but of substantially smaller length.

The end portions 16 of the conductors 12 are secured to the peripheral parts of a dished metal support 20, as shown in FIG. 2, to form a rigid sub-assembly unit, by a glass frit layer of a composite composition, in the following manner. The support is cleaned and oxidised and a base layer 21 is fired to the selected peripheral parts. A coating 22 is then provided on the base layer 21. The base layer 21 forms part of the composite glass frit layer and has a high melting point in excess of 1,000° C, and has an affinity for the material of the support. The coating forms the other part of the composite glass frit layer and is a glass frit with a significantly lower melting point of 600° C.

The exposed, oxidised, central part of the support 20 is shot-blasted to remove the oxide. The central part of the support is then selectively silver plated, employing the composite glass frit layer 21, 22 as a mask, and a gold flake 23 is bonded to the silver. The conductors 12 are secured to the support by melting the glass frit coating 22 and placing the conductor end portions 16 onto the coating, to complete the sub-assembly unit.

A silicon semiconductor device 24 is mounted on the rigid sub-assembly unit by being alloyed to the gold flake 23, the semiconductor device having a contact-bearing face remote from the support 20. The arrangement is such that the end portions 16 of the conductors are adjacent to the device contacts (not shown). Thin gold wire leads 25 are bonded by ultrasonic or thermo-compression techniques to extend individually between each device contact and associated conductor end portions 16.

A dished metal capping member 26 is secured to parts of the conductor end portions 16 spaced from the wires 25. For this purpose the capping member 26 has on it a glass frit base layer 27 with a high melting point in excess of 1,000° C, and with an affinity for the material of the capping member. The base layer may be the same as the base layer on the support. Before firing the base layer to the whole of the surface of the capping member to be opposite to the support 20, this surface of the capping member is cleaned and oxidised. The glass frit base layer 27 is then partially covered with an epoxy resin coating 28, the epoxy resin coating being on only the rim parts of the capping member. The conductors are secured to the capping member 26 by curing the epoxy resin coating 28. The epoxy resin is cured by mixing together its two constituent parts and heating to a temperature of 100° C. Thus, the semiconductor device is sealed within the package construction, and because of the low curing temperature of the coating the semiconductor device 23 is not adversely affected when securing the capping member to the rigid sub-assembly unit. Alternatively, the epoxy resin coating 28 may cover the whole of the glass frit base layer 27. The provision of the glass frit base layer on the whole of the surface of the capping member opposite to the support insulates the gold wire leads 25 from the capping member.

Because of temperature cycling during the fabrication of the package construction and when the semiconductor device is being sealed, or when the packaged device is operating under normally-encountered conditions, it is also desirable that the materials of the support, the composite glass frit layer on the support, and the capping member have values for their co-efficients of linear expansion substantially the same. Thus, it is convenient to have the support and the capping member of the same material. The co-efficient of linear expansion of the material of the conductors must not be so different from that of the support and the capping member, and hence also from that of the composite glass frit layer on the support, that the seal between the conductors and the composite glass frit layer is likely to be broken. The value of the co-efficients of linear expansion of the glass frit base layer and of the epoxy resin coating on the capping member are of much less importance in these respects. The material of the support is selected so that its co-efficient of linear expansion is substantially the same as that of the semiconductor material of the device. Thus, when the semiconductor material is silicon the support and the capping member may be of a nickel-iron alloy having a co-efficient of linear expansion substantially the same as that of silicon.

Another embodiment of the package construction according to the present invention is shown at 30 in FIG. 3. Parts of the package construction 30 identical with or closely resembling parts of the package construction 10 are given the same reference numbers as the parts of the embodiment 10 of FIG. 2.

The package construction 30 of FIG. 3 is the same as the package construction 10 of FIG. 2 except that the epoxy resin coating on the glass frit base layer 27 on the capping member 26 is replaced by a glass frit coating 32 having a low melting point i.e., below 550°C. The conductors are secured to the capping member 26 by melting the glass frit coating 32. Thus, the semiconductor device is sealed within the package construction, and because of the low melting point of the coating the semiconductor device 24 is not adversely affected when securing the capping member to the rigid sub-assembly unit. The glass frit coating is shown provided on the whole of the surface of the glass frit base layer 27 on the capping member opposite to the support, although it may be on only the peripheral, rim parts of the capping member.

Desirably the glass frit coating 32 on the capping member has a melting point as low as possible, so as to reduce the risk of adversely affecting the semiconductor device when securing the capping member to the rigid sub-assembly unit, and for a silicon semiconductor device must be below 550° C. This coating differs from the coating 22 on the support. However, it is required only to have a slight mismatch between the values of the co-efficients of linear expansion of the support, the capping member, and the composite glass frit layers on the support and the capping member. Again, it is convenient to have the support and the capping member of the same material, although the composition of the glass frit coating on the capping member may influence the composition of the capping member, the support and the base glass frit layers. Thus, it may be required that the support and the capping member are of nickel or steel. These metals have co-efficients of linear expansion sufficiently different from that of silicon for an intermediate member of a material with a co-efficient of linear expansion close to that of silicon to be required to be secured between the support and the semiconductor device.

A modification of the package construction 30 of FIG. 3 is indicated at 40 in FIG. 4. Parts of the package construction 40 identical with or closely resembling parts of the package construction 30 are given the same reference numbers as the parts of the embodiment 30 of FIG. 3.

The package construction 40 of FIG. 4 is the same as the package construction 30 of FIG. 3 except that a suitable intermediate member 41 is provided. The intermediate member comprises part of the support, and is between the other parts of the support and the semiconductor device 24, being welded to the other parts of the support. Such an intermediate member is of a suitable alloy of iron-nickel-cobalt. The conductors may also be of the iron-nickel-cobalt alloy.

In each illustrated embodiment of package constructions according to the present invention, the capping member 26 protects and does not interfere with the bonds of the electrical interconnections extending between the conductors and the device contacts, and enables the package construction 10 to be completed by moulding a suitable plastics material 50, as shown in FIG. 5. The plastics material 50 may be an epoxy resin or a silicone moulding compound. Then the boundary part 13 of the lead frame 11 is removed to render the conductors 12 electrically discrete. The discrete conductors are bent to form the package construction shown in FIG. 5.

A package construction according to the present invention comprises a structure which is easily fabricated and provides reliable seals. The composite glass frit layer on the support provides the required insulation between the conductors and the support, the base glass frit layer and the adhesive coating on the capping member insulate the conductors from the capping member. The compositions of the coatings on the base glass frit layers are selected so as not to interfere with the base layers. The lead frames may not be located on the supports with precise accuracy and the capping member may easily be located on the rigid sub-assembly unit. The base glass frit layers and the coatings may easily be provided on selected peripheral parts of the support and the capping member. Thus, only selected parts of the conductors may be embedded in the coatings, and it is not required to have the coatings in contact with the semiconductor device or with the electrical interconnections between the device contacts and the adjacent conductor end portions. The bonding of the semiconductor device to unglazed parts of the metal support ensures that there is a good rate of heat transfer from the device to the support during operation of the device under normally encountered conditions. Hence, the temperature of the device operating under such conditions is kept to a satisfactorily low value.

The sub-assembly unit of the support and the lead frame is inherently rigid and hence is easily handled and transported. This rigidity also obviates the necessity of providing tie-bars between the constituent conductors of the lead frame, especially if the conductors are of a material having sufficient rigidity for this purpose.

Instead of employing thin gold wire leads for the electrical interconnections a preformed pattern of leads may be bonded to the conductors and to the device contacts to extend therebetween. The preformed pattern of leads may be on a substrate of insulating material.

The support and the capping member may have any convenient shape.

The lead frames employed in the fabrication of package constructions according to the present invention may be initially in the form of a strip as shown in FIG. 1. The fabrication of the package constructions and the hermetic sealing of the semiconductor devices may be effected in batch processes, especially because of the intermediate formation of a rigid subassembly unit. Suction means for positioning the semiconductor devices on the supports, severing means, moulding apparatus and indexing apparatus all may be embodied in automatic apparatus to enable the processes to be completed automatically.

What we claim:

1. A package construction for a semiconductor device including a sub-assembly unit having a metal support to which the semiconductor device is bonded, conductors initially comprising a lead frame, and selectively on peripheral parts of the support a first composite glass layer having a composite composition comprising a first glass base layer with an affinity for the material of the support, and on said first glass base layer securing said conductors onto said support a first glass coating with a melting point below that of said first glass base layer whereby a minimum thickness of said first glass base layer insulates said conductors from said support, said package construction also including, to seal a semiconductor device bonded to said support within said package, a metal capping member secured to said sub-assembly unit, on said capping member a second composite glass layer having a composite composition comprising a second glass base layer with an affinity for the material of said capping member, and on at least part of said second glass base layer of said second composite layer a second, adhesive coating of glass having a melting point lower than the melting point of said first glass coating of said first composite layer and lower than said second glass base layer of said second composite layer so as to maintain the accurate alignment of said conductors embedded in said first glass coating with respect to said semiconductor device and to prevent damage to said semiconductor device, when so secured said conductors being insulated from said capping member, and said support said capping member and said first composite glass layer on said support having co-efficients of linear expansion substantially the same.

2. A package construction as claimed in claim 1 in which the co-efficients of linear expansion of said support and the semiconductor material of said semiconductor device are substantially the same and the melting point of said first and second glass base layers on said support and said capping member are substantially greater than the respective melting points of the respective adjacent layers, said adjacent layers being glass.

3. A package construction as claimed in claim 1 in which said support and said capping member have a dished shape, and said first composite glass layer is on only the rim parts of said support.

4. A package construction as set forth in claim 1 wherein said second adhesive coating on said capping member comprises a glass having a melting point below 550°C, said melting point of said first glass coating on said support being less than 600°C and said melting point of first and second said glass base layers on said support and said capping member having melting points in excess of 1,000°C.

5. A package construction as claimed in claim 4 in which said support and said capping member have a dished shape, and said first composite glass layer is on only the rim parts of said support.

6. A packaged semiconductor device including a sub-assembly unit and a metal capping member as claimed in claim 1, said device being bonded to said sub-assembly unit and said capping member being secured to said sub-assembly unit, the arrangement being such that an end portion of each conductor is adjacent to a contact-bearing face of said semiconductor device, and electrical interconnections are provided to extend individually between the contacts on said device and the end portions of said conductors.

7. A packaged semiconductor device including a sub-assembly unit and a metal capping member as claimed in claim 4 said device being bonded to said sub-assembly unit and said capping member being secured to said sub-assembly unit, the arrangement being such that an end portion of each conductor is adjacent to a contact-bearing face of said semiconductor device, and electrical interconnections are provided to extend individually between the contacts on said device and the end portions of said conductors.

* * * * *